US00RE37847E

(19) United States
(12) Reissued Patent
Henley et al.

(10) Patent Number: US RE37,847 E
(45) Date of Reissued Patent: Sep. 17, 2002

(54) METHOD AND APPARATUS FOR TESTING LCD PANEL ARRAY PRIOR TO SHORTING BAR REMOVAL

(75) Inventors: Francois J. Henley, Los Gatos; Stephen Barton, Los Altos, both of CA (US)

(73) Assignee: Photon Dynamics, Inc., San Jose, CA (US)

(21) Appl. No.: 09/741,713

(22) Filed: Dec. 18, 2000

Related U.S. Patent Documents

Reissue of:
(64) Patent No.: 5,081,687
Issued: Jan. 14, 1992
Appl. No.: 07/621,190
Filed: Nov. 30, 1990

(51) Int. Cl.[7] ..... G06K 9/00
(52) U.S. Cl. ..... 382/141; 345/87; 345/904; 348/129; 382/309
(58) Field of Search ..... 382/141, 309; 345/87, 904; 348/129

(56) References Cited

U.S. PATENT DOCUMENTS

| | | | |
|---|---|---|---|
| 4,368,523 A | 1/1983 | Kawate | 365/63 |
| 4,507,605 A | 3/1985 | Geisel | 324/73 |
| 4,631,576 A | 12/1986 | St. John | 358/65 |
| 4,776,022 A | 10/1988 | Fox et al. | 382/8 |
| 4,819,038 A | 4/1989 | Alt | 357/4 |
| 4,820,222 A | 4/1989 | Holmberg et al. | 445/3 |
| 4,825,201 A | 4/1989 | Watanabe at al. | 340/717 |
| 4,870,357 A | 9/1989 | Young et al. | 324/158 |
| 4,899,105 A | 2/1990 | Akiyama | 324/158 |
| 5,017,755 A | 5/1991 | Yahagi et al. | 219/121.68 |
| 5,034,683 A | 7/1991 | Takahashi et al. | 324/158 |

OTHER PUBLICATIONS

Wisnieff et al., *In–Process Testing of Thin–Film Transistor Arrays*, SID 90 Digest, pp. 190–193.
*Unsurpassed Technology Resources, and Commitment Make Hitachi Your Best LCD Partner* (2 pages).
Luo et al., *Testing and Qualifications of a–Si TFT–LC Color Cells for Military Avionics Applications*, SID 90 Digest, pp. 194–196.
Becker et al., *Measurement of Electro–Optic Characteristics of LCDs*, SID 90 Digest, pp. 163–166.

*Primary Examiner*—Bhavesh Mehta
(74) *Attorney, Agent, or Firm*—Townsend and Townsend and Crew, LLP

(57) ABSTRACT

Final testing of an LCD panel or the like is performed after preliminary testing for short circuit defects. During final testing, the panel is exposed to signals at the shorting bars and the resulting display pattern is imaged. The resulting image data then is processed at a computer system to determine whether the resulting display pattern differs from an expected display pattern. If differences are present then an open circuit or pixel defect is present. The applied test signals and the pattern or differences determine the type of defect present. For an open circuit defect along a gate line, a partial row (column) of the resulting display pattern does not activate. For an open circuit along a drive line, a partial column (row) of the resulting display does not activate. Pixel shorts are identified by applying test signals to the shorting bars during a first test cycle, then imaging the display during a second test cycle after at least one of the test signals is removed. Pixels which remain active that should be inactive have short circuit defects.

64 Claims, 6 Drawing Sheets

METHOD AND APPARATUS FOR TESTING LCD PANEL ARRAY PRIOR TO SHORTING BAR REMOVAL

Matter enclosed in heavy brackets [ ] appears in the original patent but forms no part of this reissue specification; matter printed in italics indicates the additions made by reissue.

CROSS REFERENCE TO RELATED APPLICATION

This invention is related to commonly-assigned U.S. patent application Ser. No. 07/557,257, filed July 24, 1990 of the same inventor for METHOD AND APPARATUS FOR TESTING AN LCD PANEL ARRAY USING A MAGNETIC FIELD SENSOR.

BACKGROUND OF THE INVENTION

This invention relates to testing of liquid crystal display (LCD) panel arrays, and more particularly to a method and apparatus for testing LCD panel arrays for open circuit and pixel defects by applying test signals to panel shorting bars.

LCD panels typically are formed with a liquid crystal material sandwiched between an active plate and a ground plate. Polarizers, colorizing filters and spacers also are included between the plates. During fabrication, many active [plates] *panels* may be formed on a single glass plate. In each area of the glass plate which is to form an active [plate,] *panel,* drive lines, gate lines and drive elements are formed. Typically, thin-film transistors are used for the drive elements.

Each active panel has an electro-static discharge (ESD) shorting bar at each of the four edges of the active plate. The ESD bar shorts all the drive lines or gate lines which terminate at a respective edge. For an interdigitated panel, drive lines are terminated at two opposing edges while gate lines are terminated at the other two edges. Thus, four shorting bars are included, one per panel edge.

Until scribing and final testing of the LCD panel, the ESD bars remain attached to the panel so as to avoid electro-static charge buildup. Prolonged separation of the panel from the shorting bar or another grounding apparatus may cause the electro-static charge to accumulate and cause damage to the active panel circuitry. Accordingly, a method is needed for testing the LCD panel array with the ESD shorting bars in place.

Referring to FIG. 1, a typical active matrix LCD panel segment 10 is shown consisting of an array of pixels 12. Each pixel 12 is activated by addressing simultaneously an appropriate drive line 14 and gate line 16. A drive element 18 is associated with each pixel 12. The drive lines 14, gate lines 16, pixels 12 and pixel drive elements 18 are deposited on the clear glass "active" plate by a lithographic or similar process. Because of the high pixel densities, the close proximity of the gate lines and drive lines, and the complexity of forming the pixel drive elements, there is a significant probability of defects occurring during the manufacturing process.

Known testing methods for high density LCD panels include contact testing methodologies which require connection to and testing of each individual row/column intersection within the panel array. For such testing, advanced probing technology is necessary to establish reliable contacts among the densely populated pixel elements. A high density LCD array includes 640 by 480 pixel elements per color. A typical test time for such a panel is approximately 2 hours. For a color panel having the three primary colors red green and blue ("RGB color panel"), a typical test cycle requires additional connections and requires additional testing time. The time and expense of testing, although necessary, is a limiting factor to the commercial success of large array LCD panels. A faster and more efficient testing method is needed to reduce the testing costs, and thereby reduce the product costs of LCD panels so as to compete with CRT and other display types.

Accordingly, it is desirable to be able to test large arrays easily, without direct individual electrical connection and with connections only as needed.

SUMMARY OF THE INVENTION

According to the invention, an LCD panel or the like is tested for open circuit defects and pixel defects after preliminary short circuit testing is complete. According to one aspect of the invention, the panel undergoes open circuit and pixel testing by exposing the panel to test signals at the contacts of each respective shorting bar. The resulting display pattern then is imaged and compared to an expected display pattern to detect panel defects.

According to another aspect of the invention, the resulting display is imaged of a TV camera, line-scan camera or other optical sensing instrument. Such camera or instrument images the display panel and transmits the resulting image signals to a computer system for processing and storage as sensed image data. The computer system compares the sensed image data to expected image data to determine whether there are any differences between the resulting display pattern and the expected display pattern.

As there are only a finite number of test patterns which may be applied to the shorting bars, there are only a finite number of expected display patterns. By having the computer control or monitor the test signal selection, the computer is able to select the appropriate expected display pattern, and thus, select the appropriate expected image data to be compared with the sensed image data.

According to another aspect of the invention, a pixel short circuit defect is detected by applying sequential test cycles of test signals to the shorting bars. During a first cycle, an active signal is applied to the shorting bars which are connected to the gate lines, while another active signal is applied to the shorting bars which are connected to the drive lines. Then, during a second cycle, the active signal which is applied to the drive lines is switched to an inactive signal. If any pixels remain active, then there is a pixel short circuit. Alternatively, the active signal applied to the gate lines may be switched to an inactive state. Any pixels that become inactive result from a pixel short circuit.

The invention will be better understood by reference to the following detailed description taken in conjunction with the accompanying drawings.

DESCRIPTION OF THE PREFERRED EMBODIMENT

Panel Configuration

Figure 1:
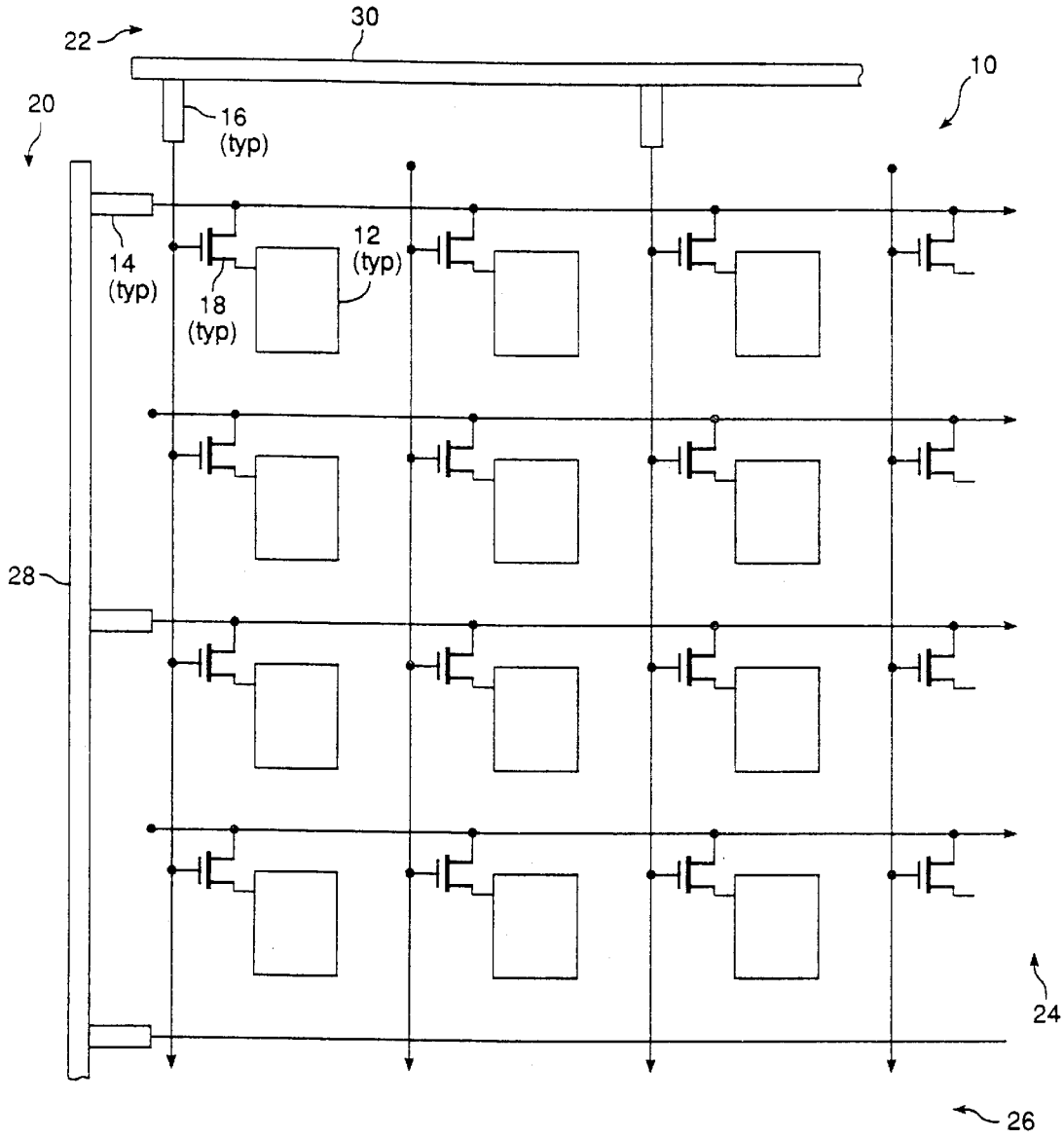
FIG. 1 is a block diagram illustrating a portion of an LCD panel array.

Referring to FIG. 1, a section of an LCD panel 10 is shown including several pixels 12. Associated with each pixel 12 is a drive line 14, a gate line 16, and a drive element 18, as previously described. For an interdigitated panel (shown), every other drive line is terminated along one panel boundary 20, while the other drive lines are terminated along the opposite, but parallel, boundary 24 (see FIG. 2). Similarly, every other gate line 16 is terminated along one panel boundary 22 adjacent and generally orthogonal to the drive line panel boundaries 20, 24, while the other gate lines 16 are terminated along the opposite panel boundary 26.

Figure 2:
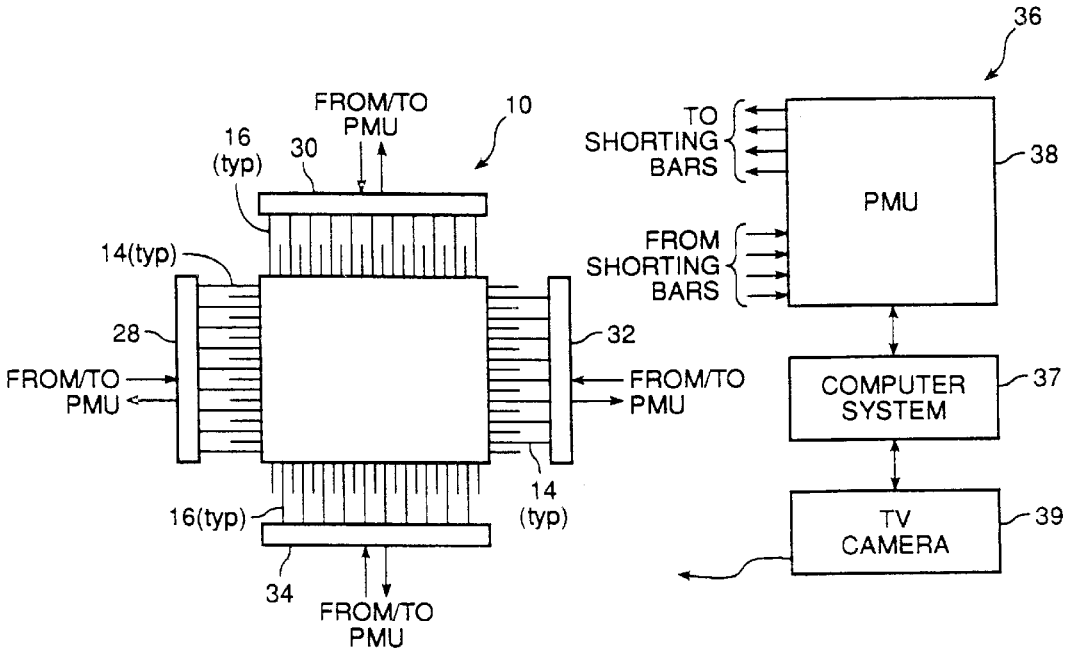
FIG. 2 is a block diagram of a test configuration for testing the LCD panel of FIG. 1 according to an embodiment of this invention.
Figure 3:
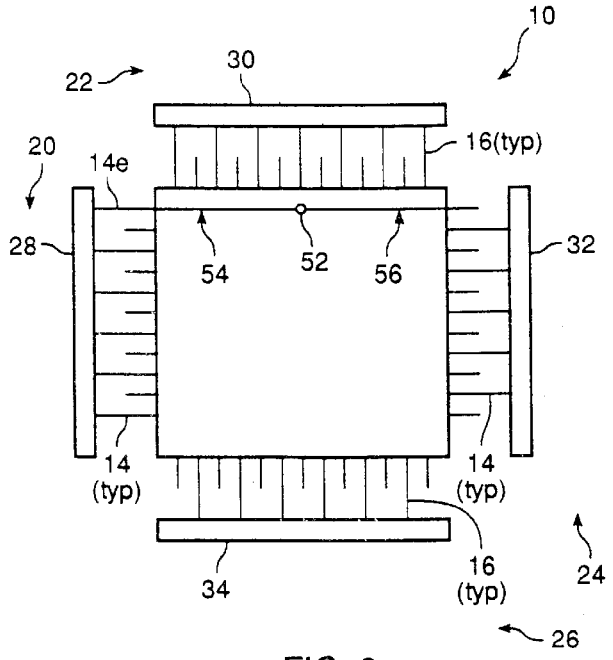
FIG. 3 is a block diagram of an LCD panel of FIG. 1 depicting an open circuit defect.

During final testing of the LCD panel 10, the electro-static discharge shorting bars are present. As shown in FIGS. 1–3, there are four shorting bars 28, 30, 32, 34 for an interdigitated panel, one at each edge of the panel 10. Bar 28 shorts the drive lines 14 terminating at edge 20. Bar 30 shorts the gate lines 16 terminating at edge 22. Bar 32 shorts the drive lines 14 terminating at edge 24. Bar 34 shorts the gate lines 16 terminating at edge 26.

For a high density monochrome LCD panel, the pixel array includes 640×480 pixels (307,200 pixels). Each pixel corresponds to a single array element. By controlling the voltage levels of the test signals applied to shorting bars, the pixels are driven to correspond to white, black, or various gray levels in between.

For a high density RGB color panel there are three pixels for every one pixel of the monochrome panel. Thus, the RGB panel array includes 640×480×3 pixels (921,600 pixels). By activating a combination of the three pixels alternative colors are achieved for an array element. By activating all three pixels, a white color is achieved. According to one embodiment of an RGB interdigitated panel, each color pixel corresponds to a separate element. Thus, the drive lines for the red, blue and green pixels are connected to alternating shorting bars (28, 32), while the gate lines are also connected to alternate shorting bars (30,34).

Test Apparatus Configuration

Referring to FIG. 2, a test configuration 36 according to an embodiment of this invention is shown. The test configuration 36 includes the LCD panel 10, a computer system 37, a conventional dc parametric measurement unit (PMU) 38, and a TV camera 39. During final testing, the PMU 38 generates test signals applied to the shorting bars 28, 30, 32, 34, while the camera 39 images the resulting display pattern appearing on the panel 10. The camera 39 generates image signals which are input to the computer system 37 for processing to determine whether any defects are present.

Preliminary Short Circuit Testing

Referring to FIG. 2, the test configuration 36 for detecting short circuit defects on an LCD panel 10 is shown. To detect whether the panel 10 has any short circuit defects, a voltage signal is applied by the PMU 38 to each shorting bar 28, 30, 32, 34, while also monitoring the shorting bars 28, 30, 32, 34. Alternatively, a voltage signal may be applied to each one shorting bar in sequence while each of the other shorting bars are monitored. For example, bar 28 receives a voltage signal while bars 30, 32, and 34 are monitored by the PMU 38. The PMU 38 current sensor detect whether any current is flowing through the drive lines 14 and gate lines 16. If no current is detected by the PMU 38 at any of the shorting bars 28, 30, 32, 34, then the panel 10 has no short circuit defects and the panel is tested subsequently for open circuit defects and defective pixels. If current is flowing at one or more shorting bars, then a short circuit defect is present among the drive lines or gates lines terminating at such one or more shorting bars.

Upon completion of preliminary short circuit testing, the open circuit testing procedure is performed.

Test Signal Combinations for Open Circuit and Pixel Testing

To identify whether panel 10 has any open circuit or pixel defects, respective test signals are applied to shorting bars 28, 30, 32, 34. Under normal operation, a pixel 12 is addressed by applying an active signal to the gate line 16 and drive line 14 connected to the drive element 18 of the pixel 12. However, during testing the shorting bars 28, 30, 32, 34 are connected to respective pluralities of drive lines or gate lines. As a result, individual pixels 12 can not be addressed. For an interdigitated panel a combination of four test signals are applied to generate an expected display pattern.

Table A below lists a set of test signal combinations, along with descriptions of the expected display pattern corresponding to such test signals:

TABLE A

| FIG. | SB-28 | SB-30 | SB-32 | SB-34 | Expected Display |
|---|---|---|---|---|---|
| 4a | Black | On | Black | On | All pixels off |
| 4b | White | On | White | On | All pixels on |
| 4c | White | On | Black | On | Horizontal Stripes |
| 4d | Black | On | White | On | Inverse Horizontal Stripes |
| 4e | White | Off | White | On | Vertical Stripes |
| 4f | White | On | White | Off | Inverse Vertical Stripes |
| 4g | White | On | Black | Off | Checkerboard Cycle 1 |
| 4h | Black | Off | White | On | Checkerboard Cycle 2 |
| 4i | White | Off | Black | On | Inverse Checkerboard Cy. 1 |
| 4j | Black | On | White | Off | Inverse Checkerboard Cy. 2 |

SB-28, SB-30, SB-32, and SB-34 correspond respectively to shorting bars 28, 30, 32 and 34. The test signals which are applied to the shorting bars 28, 32 are referred to as being "White" (e.g., logic high; active) or "Black" (e.g., logic low; inactive). The test signals which are applied to the shorting bars 30, 34 are referred to as being "On" (e.g., logic high; active) or "Off" (e.g., logic low; inactive). For achieving a gray level in a monochrome panel, intermediate voltage levels between those for black and white are applied to the drive line shorting bars 28, 32.

Figure 4A:
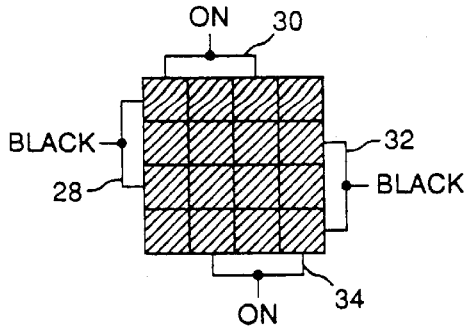
FIGS. 4a–j are diagrams of expected display patterns in response to respective test signal combinations applied according to an embodiment of this invention.
Figure 4B:
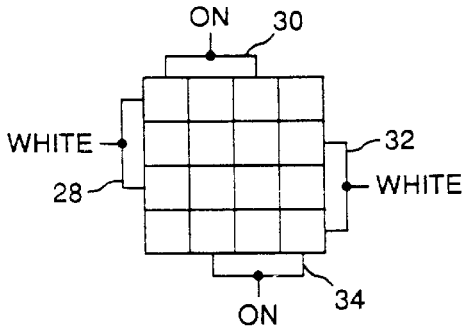
Figure 4C:
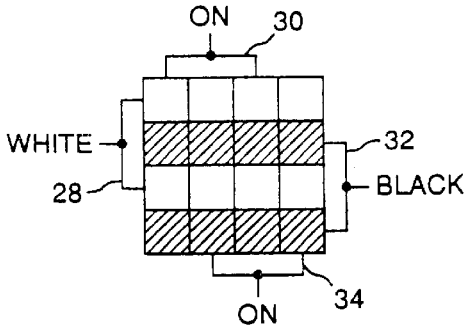
Figure 4D:
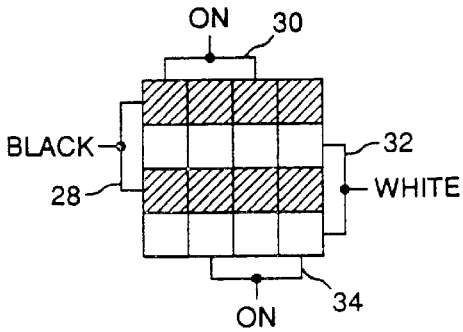
Figure 4E:
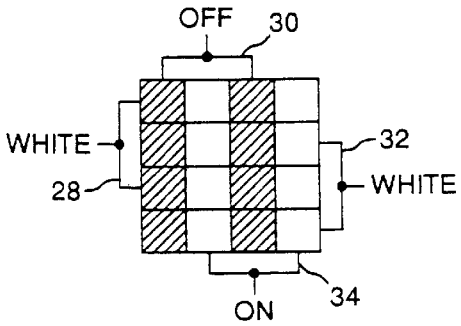
Figure 4F:
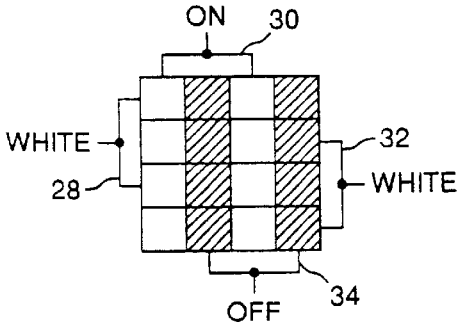
Figure 4G:
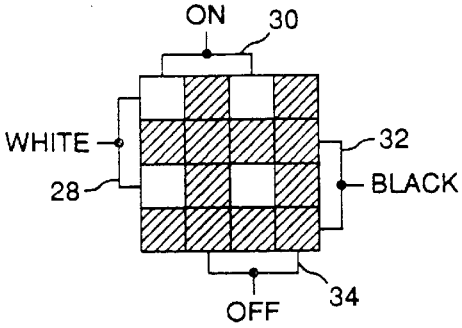
Figure 4H:
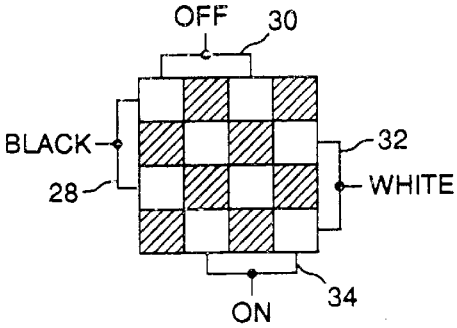
Figure 4I:
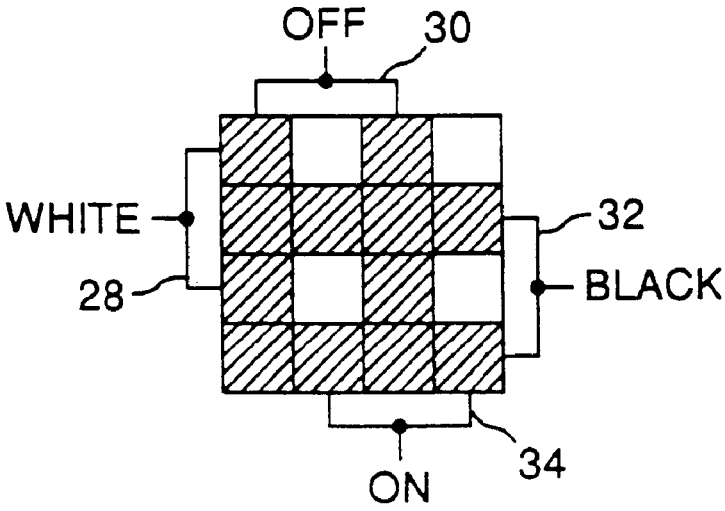
Figure 4J:
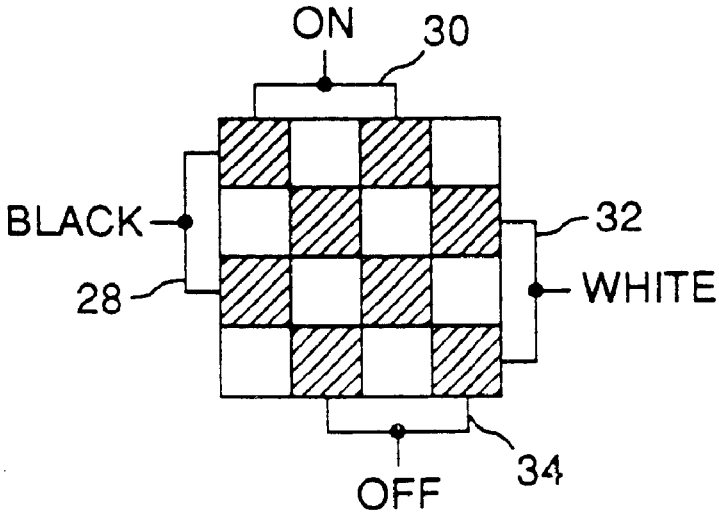

FIGS. 4a–j depict the expected display patterns listed in Table A for a small portion (e.g., 4×4 pixels) of the panel array 10. FIG. 4a shows an expected display pattern in which all pixels are inactive (e.g., dark). FIG. 4b shows an expected display pattern in which all the pixels are active (e.g., white). FIG. 4c shows an expected display pattern in which the pixels form horizontal stripes. FIG. 4d shows an expected display pattern in which the pixels form inverse horizontal stripes. FIG. 4e shows an expected display pattern in which the pixels form vertical stripes. FIG. 4f shows an expected display pattern in which the pixels form inverse and vertical stripes. FIG. 4g shows test cycle 1 for generating an expected display pattern characterized as a checkerboard pattern. FIG. 4h shows test cycle 2 for generating the expected display pattern characterized as a checkerboard pattern. FIG. 4i shows test cycle 1 for generating an expected display pattern characterized as an inverse checkerboard pattern. FIG. 4j shows test cycle 2 for generating the expected display pattern characterized as an inverse checkerboard pattern. For the patterns depicted in FIGS. 4e, 4f, 4g and 4i, the panel 10 starts as being all dark. Thereafter, test signals are applied as shown to achieve the respective expected display pattern.

For an interdigitated monochrome panel, the striped and checkerboard expected display pattern of FIGS. 4c–4j are embodied as alternating white and black stripes or checker squares. For an interdigitated color panel, the striped and checkerboard expected display patterns of FIGS. 4c–4j may appear to the human eye as alternating stripes of checker squares of differing colors. The actual pattern, however, at the pixel level is alternating dark and colored pixels.

Pixel Short Circuit Testing Procedure

According to the pixel short circuit testing procedure, short circuits in the drive elements 18 and in the pixel elements 12 are detected. Each drive element 18, according to a preferred embodiment of the panel 10, is an FET transistor having a gate, a source and a drain. The gate is coupled to a gate line 16. The source is coupled to a drive line 14. The drain is coupled to a pixel 12. Testing for cross shorts from gate to source is performed during preliminary short circuit testing. Testing for short circuits from gate to drain is done during either preliminary short circuit testing or final open circuit and pixel defect testing.

To detect a short circuit across the gate and drain of a drive element 18, test signals are applied, for generating the all dark display pattern of FIG. 4a. If any pixels 12 become active while such test signals are applied there is a short circuit defect at the drive element 18 of the active pixel 12.

To test for a short circuit in the pixel 12 itself, test signals are applied during a first cycle which correspond to the fully active (e.g. all white) display pattern of FIG. 4b. Next, during a second test cycle, the test signals at shorting bars 30, 34 are switched off. If any pixels remain active, then such pixels have a short circuit defect.

Open Circuit Defect Testing

To test for open circuit defects, one or more of the test signal combinations in Table A (other than the "all pixels off" test signal combination) are applied to the shorting bars 28, 30, 32, 34 to generate a resulting display pattern. If an open circuit defect is present, the resulting display varies from the corresponding expected display pattern. For example, an open circuit along a drive line 14 causes all pixels 12 coupled to the drive line 14 beyond the open circuit not to be activated. As a result, for a fully active expected display pattern (FIG. 4b), a line segment of inactive pixels 12 appears where active pixels 12 should appear.

FIG. 3 depicts an open circuit defect 52 on a drive line 14e. Pixels 54 to the left of the open circuit defect 52 receive the test signal applied along drive line 14e (from shorting bar 28). Pixels 56 to the right of the open circuit defect 52 are unable to receive the test signal along line 14e. Thus, such pixels 56 do not become active.

According to alternative embodiments, test signals are applied to the shorting bars 28, 30, 32, 34 in one or more of the combinations listed in Table A. According to a preferred embodiment, test signals are applied corresponding to the expected display pattern of FIG. 4b (all pixels active). If any pixels are not lit, then there is an open circuit pixel defect. If the inactive pixels form a line segment as described for FIG. 3, then there is an open circuit in the corresponding drive line or gate line. If the inactive pixels occur in isolated locations (e.g. not in a line segment) then there are open circuits at each of the inactive pixels.

Imaging and Processing of the Resulting Display Pattern

For both open circuit testing and pixel defect testing, a resulting display pattern corresponds to an expected display pattern when there are no defects present. If however, the resulting display pattern does not correspond to the expected display pattern, then a defect is present.

According to a preferred embodiment, the resulting display is imaged at TV camera 39 and sent to the computer system 37 for processing. Typically, the TV camera 39 generates analog video signals. The analog signals are then converted to digital image signals by an Analog to Digital converter (not shown) at either the camera 39, the computer system 37 or between the camera 39 and the computer system 37. The digital sensed image data then is processed at computer system 37 by comparing the sensed image data to expected image data. The expected image data is determined according to the expected display pattern.

A resulting display pattern is imaged by the TV camera 39 while test signals are applied to the shorting bars 28, 30, 32 and 34. Resulting image signals are converted to digital image data, then processed and stored at the computer system 37. The computer 37 processes the sensed image data to determine whether the resulting display pattern corresponds to the expected display pattern. The computer 37 identifies which sensed image data differs from the expected image data to locate the differences between the resulting and the expected display patterns.

Figure 5:
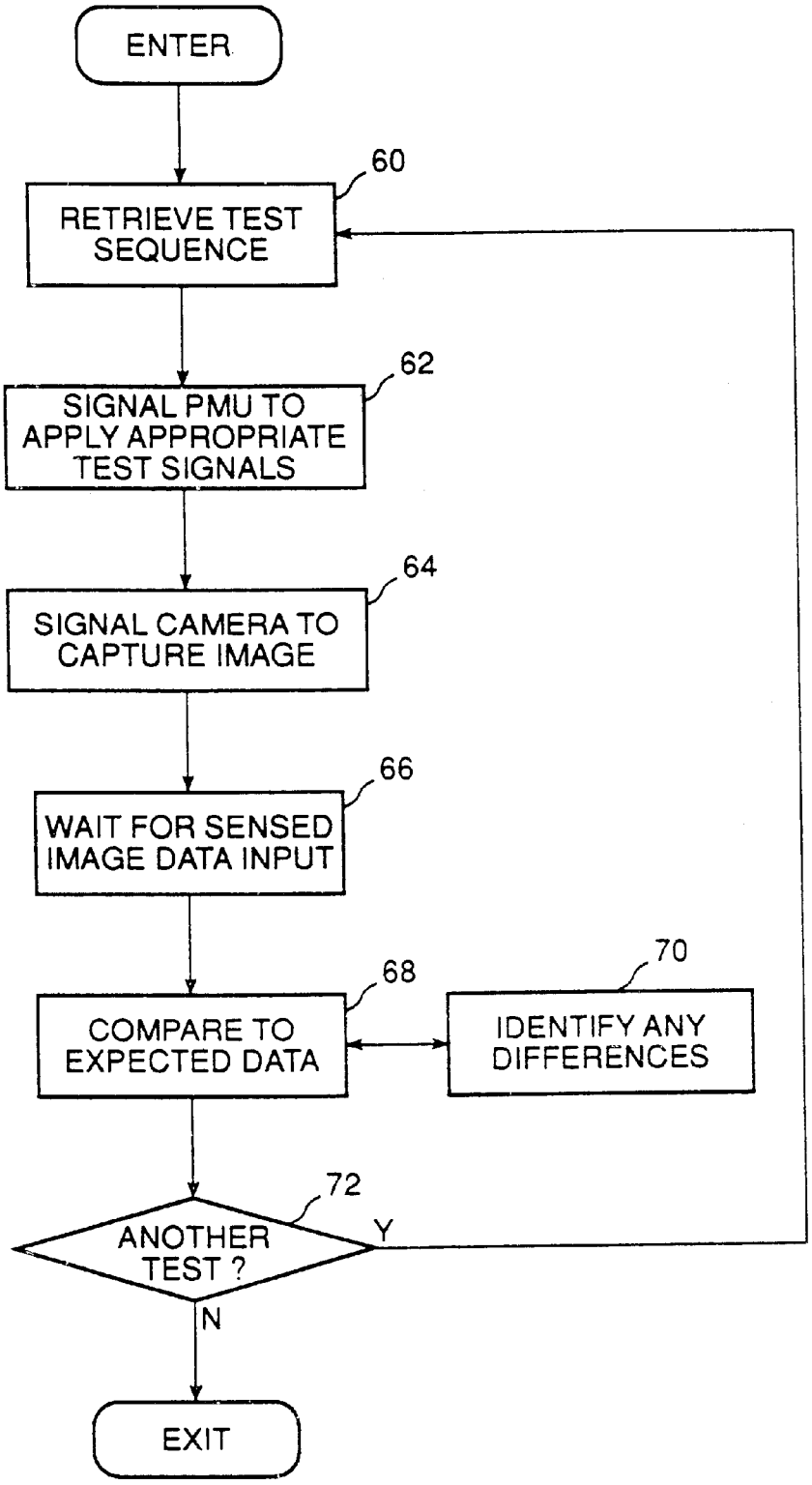
FIG. 5 is a flow chart for a test sequence according to an embodiment of this invention.

FIG. 5 is a flow chart for implementing a final test for open circuit and pixel defect testing according to one embodiment of this invention. First at step 60, a test sequence is retrieved (i.e., a standard sequence stored in memory or a sequence as defined by an operator). Then at step 62, the first test is performed by signalling the PMU 38 to apply test signals to shorting bars 28, 30, 32, 34. At step 64, the computer system 37 signals the camera 39 to image the panel 10. The camera then images the resulting display pattern and sends the sensed image data to the computer system 37. At step 66, the computer waits for sensed image data to be received. The computer system 37 then compares at step 68 the sensed image data to predefined expected image data stored in memory. The expected image data used for comparison is determined according to the particular test being implemented. If any differences are present among the data comparisons, then the panel array 10 has a defect. The computer system identifies the location of each mismatch at step 70. Additional processing may be done to process the differences and identify a line segment (and thus an open circuit drive line or gate line) or an individual pixel (and thus an open circuit pixel defect, or for an all dark expected display, a short circuit pixel or pixel drive element defect). At step 72, another test is started.

According to one example, three different tests are performed. First, test signals are applied corresponding to the all dark pattern of FIG. 4a. Any differences from the expected display correspond to short circuit pixel drive elements. Second, test signals are applied corresponding to the all active expected display pattern of FIG. 4b. Any differences from the expected display pattern correspond to an open circuit drive line, gate line, or pixel depending on the pattern of the differences. Third, a two cycle test in which test signals are applied corresponding to the all active expected display pattern of FIG. 4b during a first cycle, following by a second cycle during which the drive lines are deactivated. The expected display after the second cycle is the all dark display pattern. Any differences correspond to a short circuit in the active pixel(s).

Other tests also may be performed in which test signals corresponding to other expected display patterns (i.e., those in FIGS. 4c–4j or other patterns from test signal combinations not explicitly described) are applied.

Sensed Image Data Groups

The TV camera 39 or other optical sensing instrument used to image the resulting display pattern, in effect, scans the panel array 10 or a portion of the panel array 10. The TV camera 39 resolution or digital sampling may correspond to the panel pixels on a one to one basis or on an 'n' to one basis where 'n' is greater than one. Typically, a group of sensed image data corresponds to one pixel. Thus, a group size for the sensed image data may be one (e.g., one memory data item per pixel) or larger (e.g., several memory data items per pixel). For a grouping of several data items per pixel, all the data items corresponding to one pixel are summed to generate a value corresponding to the luminous intensity of the pixel. Each intensity sums is compared to specification limits for the LCD panel array according to whether the test signals applied correspond a dark pixel, a white pixel or some intermediate gray level pixel. Accordingly, gray scale testing also may be performed as part of the comparison with the expected display pattern data. For a color panel, not only the intensity, but the color of each pixel also is compared.

Conclusion

Although a preferred embodiment of the invention has been illustrated and described, various alternatives, modifications and equivalents may be used. For example, although a TV camera 39 is described as the apparatus for imaging the display panel, a video camera, line-scan camera or other optical sensing instrument may used instead. Therefore, the foregoing description should not be taken as limiting the scope of the invention which is defined by the appended claims.

What is claimed is:

1. A method for testing an LCD panel having a plurality of drive lines oriented in a first direction and a plurality of gate lines oriented in a second generally orthogonal direction creating row/column intersections, each drive line which terminates along a first edge of the panel being shorted together by a first shorting means, each gate line which terminates along a second edge of the panel being shorted together by a second shorting means, said method comprising the steps:

applying a first test signal to said first shorting means and a second test signal to said second shorting means to generate a first resulting display pattern;

comparing said first resulting display pattern to an expected display pattern, a difference between the resulting display pattern and the expected display pattern signifying that the panel has a defect.

2. The method of claim 1, further comprising the step of imaging a portion of said first resulting display pattern to generate sensed image data; wherein said expected display pattern comprises expected image data; and wherein said step of comparing comprises processing said sensed image data by comparing said sensed image data to expected image data, a difference between sensed image data and expected image data resulting from a panel defect.

3. A method for testing an LCD panel having a plurality of drive lines oriented in a first direction and a plurality of gate lines oriented in a second generally orthogonal direction creating row/column intersections, each drive line which terminates along a first edge of the panel being shorted together by a first shorting means, each drive line which terminates along a second opposing edge of the panel being shorted together by a second first shorting means, each gate line which terminates along a third edge of the panel being shorted together by a third shorting means, each gate line which terminates along a fourth edge of the panel being shorted together by a fourth shorting means, said method comprising the steps:

applying a first test signal to said first shorting means, a second test signal to said second shorting means, a third test signal to said third shorting means and a fourth test signal to said fourth shorting means to generate a resulting display pattern;

comparing said resulting display pattern to an expected display pattern, a difference between the resulting display pattern and the expected display pattern signifying that the panel has a defect.

4. The method of claim 3, further comprising the step of imaging a portion of said resulting display pattern to generate sensed image data; wherein said expected display pattern comprises expected image data; and wherein said step of comparing comprises processing said sensed image data by comparing said sensed image data to expected image data, a difference between sensed image data and expected image data resulting from a panel defect.

5. An apparatus for testing an LCD panel, the panel having a plurality of drive lines oriented in a first direction and a plurality of gate lines oriented in a second generally orthogonal direction creating row/column intersections, each drive line which terminates along a first edge of the panel being shorted together by a first shorting means, each gate line which terminates along a second edge of the panel being shorted together by a second shorting means, said apparatus comprising:

means for applying a first test signal to said first shorting means and for applying a second test signal to said second shorting means to generate a resulting display pattern;

means for imaging the resulting display pattern to generate sensed image data;

means for comparing the sensed image data to expected image data, a difference between the sensed image data and the expected image data signifying that the panel has a defect.

6. The apparatus of claim 5, in which the panel is an interdigitated panel having another plurality of drive lines which are shorted together by a third shorting means and another plurality of gate lines which are shorted by a fourth shorting means; in which said applying means also is for applying a third test signal to the third shorting means and a fourth test signal to the fourth shorting means to generate said resulting display pattern.

7. The apparatus of claim 6, in which said first test signal and said third test signal are inactive, and said second test signal and said fourth test signal are active, and wherein a difference between sensed image data and expected image data signifies a pixel short circuit defect.

8. The apparatus of claim 6, in which said first, second, third and fourth test signals are active, and wherein a difference between sensed image data and expected image data signifies that the panel has an open circuit defect.

9. The apparatus of claim 6, in which said first, second, third and fourth test signals are active during a first test cycle, said first and third test signals being switched to inactive during a second test cycle, wherein a difference between sensed image data and expected image data during said second test cycle signifies that the panel has a short circuit.

*10. The method of claim 2 wherein said imaging step comprises imaging said portion of said first resulting display pattern using an optical sensing instrument to generate said sensed image data.*

*11. The method of claim 10 wherein said optical sensing instrument is a television camera.*

*12. The method of claim 10 wherein said optical sensing instrument is a video camera.*

*13. The method of claim 10 wherein said optical sensing instrument is a line-scan camera.*

*14. The method of claim 1 further comprising imaging a portion of said first resulting display pattern to generate an expected display pattern using a sensing instrument.*

*15. The method of claim 14 wherein the sensing instrument comprises a video camera.*

*16. The method of claim 14 wherein the sensing instrument comprises a television camera.*

*17. The method of claim 14 wherein the sensing instrument comprises a line-scan camera.*

*18. The method of claim 4 wherein said imaging step comprises imaging said portion of said resulting display pattern using an optical sensing instrument to generate said sensed image data.*

*19. The method of claim 18 wherein said optical sensing instrument is a video camera.*

*20. The method of claim 18 wherein said optical sensing instrument is a television camera.*

*21. The method of claim 18 wherein said optical sensing instrument is a line-scan camera.*

*22. The apparatus of claim 5, wherein said means for imaging comprises a sensing instrument.*

*23. The apparatus of claim 22 wherein the sensing instrument is an optical sensing instrument.*

*24. The apparatus of claim 22 wherein said optical sensing instrument is selected from a television or video camera or a line-scan camera.*

*25. The method of claim 3 wherein the expected display pattern is for an all pixels turned off logic state.*

*26. The method of claim 3 wherein the expected display pattern is for an all pixels turned on logic state.*

*27. The method of claim 3 wherein the expected display pattern is for a horizontal stripes logic state.*

*28. The method of claim 3 wherein the expected display pattern is for an inverse horizontal stripes logic state.*

*29. The method of claim 3 wherein the expected display pattern is for a checkerboard cycle 1 logic state.*

*30. The method of claim 3 wherein the expected display pattern is for a checkerboard cycle 2 logic state.*

*31. The method of claim 3 wherein the expected display pattern is for an inverse checkerboard cycle 1 logic state.*

*32. The method of claim 3 wherein the expected display pattern is for an inverse checkerboard cycle 2 logic state.*

*33. The method of claim 1 wherein the first test signal and the second test signal are provided at an intermediary voltage to create a mid-level logic state.*

*34. The method of claim 1 wherein the defect is a short circuit.*

*35. The method of claim 1 wherein the defect is an open circuit.*

*36. The method of claim 1 wherein said LCD panel comprises an array of pixels.*

*37. The method of claim 1 wherein said LCD panel is composed of a portion of a plate.*

*38. The method of claim 3 wherein said LCD panel comprises an array of pixels.*

*39. The method of claim 3 wherein said LCD panel is composed of a portion of a plate.*

*40. The apparatus of claim 5 wherein said LCD panel comprises an array of pixels.*

*41. The apparatus of claim 5 wherein said LCD panel is composed of a plate.*

*42. The method of claim 1 wherein said testing method of the LCD panel is performed on a first plate having said plurality of drive lines and said plurality of gate lines.*

*43. The method of claim 42 further comprising imaging a portion of said first resulting display pattern to generate an expected display pattern using a sensing instrument.*

*44. The method of claim 1 wherein said testing method of the LCD panel is performed on a first plate having said plurality of drive lines and said plurality of gate lines, and a plurality of transistors, where each of the transistors is coupled between at least one drive line and at least one gate line.*

*45. The method of claim 44 further comprising imaging a portion of said first resulting display pattern to generate an expected display pattern using a sensing instrument.*

*46. The method of claim 45 wherein the sensing instrument is selected from a video camera, a line scan camera, or a television camera.*

*47. The method of claim 1 wherein said testing method of the LCD panel is performed on a portion of a first plate having said plurality of drive lines and said plurality of gate lines, and a plurality of transistors, where each of the transistors is coupled between at least one drive line and at least one gate line, the first plate further comprising a plurality of capacitors, where each of the capacitors is coupled to one of the transistors.*

*48. The method of claim 47 further comprising imaging a portion of said first resulting display pattern to generate an expected display pattern using a sensing instrument.*

*49. The method of claim 1 wherein said testing method of the LCD panel is performed on a portion of first plate having said plurality of drive lines and said plurality of gate lines, and a plurality of transistors, where each of the transistors is coupled between at least one drive line and at least one gate line, the first plate further comprising a plurality of capacitors, where each of the capacitors is coupled to one of the transistors, the first plate being coupled to a second plate having a color filter coupled thereto, and a liquid crystal display material sandwiched between said first and second plates.*

*50. The method of claim 49 further comprising imaging a portion of said first resulting display pattern to generate an expected display pattern using a sensing instrument.*

*51. The method of claim 50 wherein the sensing instrument is selected from a video camera, a line scan camera, or a television camera.*

*52. The method of claim 1 wherein said testing method of the LCD signal is performed on a portion of a first plate having said plurality of drive lines and said plurality of gate lines, and a plurality of transistors, where each of the transistors is coupled between at least one drive line and at least one gate line, the first plate further comprising a plurality of capacitors, where each of the capacitors is*

*coupled to one of the transistors, the first plate being coupled to a second plate through a liquid crystal display material sandwiched between said first and second plates.*

*53. The method of claim 52 further comprising imaging a portion of said first resulting display pattern to generate an expected display pattern using a sensing instrument.*

*54. The method of claim 53 wherein the sensing instrument is selected from a video camera, a line scan camera, or a television camera.*

*55. The method of claim 3 wherein said testing method of the LCD panel is performed on a portion of a first plate having said plurality of drive lines and said plurality of gate lines.*

*56. The method of claim 3 wherein said testing method of the LCD panel is performed on a portion of a first plate having said plurality of drive lines and said plurality of gate lines, and a plurality of transistors, where each of the transistors is coupled between at least one drive line and at least one gate line.*

*57. The method of claim 3 wherein said testing method of the LCD panel is performed on a portion of a first plate having said plurality of drive lines and said plurality of gate lines, and a plurality of transistors, where each of the transistors is coupled between at least one drive line and at least one gate line, the first plate further comprising a plurality of capacitors, where each of the capacitors is coupled to one of the transistors.*

*58. The method of claim 3 wherein said testing method of the LCD panel is performed on a portion of a first plate having said plurality of drive lines and said plurality of gate lines, and a plurality of transistors, where each of the transistors is coupled between at least one drive line and at least one gate line, the first plate further comprising a plurality of capacitors, where each of the capacitors is coupled to one of the transistors, the first plate being coupled to a second plate having a color filter coupled thereto, and a liquid crystal display material sandwiched between said first and second plates.*

*59. The method of claim 3 wherein said testing method of the LCD panel is performed on a portion of a first plate having said plurality of drive lines and said plurality of gate lines, and a plurality of transistors, where each of the transistors is coupled between at least one drive line and at least one gate line, the first plate further comprising a plurality of capacitors, where each of the capacitors is coupled to one of the transistors, the first plate being coupled to a second plate through a liquid crystal display material sandwiched between said first and second plates.*

*60. The apparatus of claim 5 wherein said testing method of the LCD panel is performed on a portion of a first plate having said plurality of drive lines and said plurality of gate lines.*

*61. The apparatus of claim 5 wherein said testing method of the LCD panel is performed on a portion of a first plate having said plurality of drive lines and said plurality of gate lines, and a plurality of transistors, where each of the transistors is coupled between at least one drive line and at least one gate line.*

*62. The apparatus of claim 5 wherein said testing method of the LCD panel is performed on a portion of a first plate having said plurality of drive lines and said plurality of gate lines, and a plurality of transistors, where each of the transistors is coupled between at least one drive line and at least one gate line, the first plate further comprising a plurality of capacitors, where each of the capacitors is coupled to one of the transistors.*

*63. The apparatus of claim 5 wherein said testing method of the LCD panel is performed on a portion of a first plate having said plurality of drive lines and said plurality of gate lines, and a plurality of transistors, where each of the transistors is coupled between at least one drive line and at least one gate line, the first plate further comprising a plurality of capacitors, where each of the capacitors is coupled to one of the transistors, the first plate being coupled to a second plate having a color filter coupled thereto, and a liquid crystal display material sandwiched between said first and second plates.*

*64. The apparatus of claim 5 wherein said testing method of the LCD panel is performed on a portion of a first plate having said plurality of drive lines and said plurality of gate lines, and a plurality of transistors, where each of the transistors is coupled between at least one drive line and at least one gate line, the first plate further comprising a plurality of capacitors, where each of the capacitors is coupled to one of the transistors, the first plate being coupled to a second plate through a liquid crystal display material sandwiched between said first and second plates.*

* * * * *

UNITED STATES PATENT AND TRADEMARK OFFICE

CERTIFICATE OF CORRECTION

PATENT NO. : RE 37,847 E
DATED : September 17, 2002
INVENTOR(S) : Francois J. Henley et al.

It is certified that error appears in the above-identified patent and that said Letters Patent is hereby corrected as shown below:

Columns 10 and 11,
Lines 61-3, should read:

-- 52. The method of claim 1 wherein said testing method of the LCD panel is performed on a portion of a first plate having said plurality of drive lines and said plurality of gate lines, and a plurality of transistors, where each of the transistors is coupled between at least one drive line and at least one gate line, the first plate further comprising a plurality of capacitors, where each of the capacitors is coupled to one of the transistors, the first plate being coupled to a second plate through a liquid crystal display material sandwiched between said first and second plates. --

Signed and Sealed this

Seventeenth Day of December, 2002

JAMES E. ROGAN
*Director of the United States Patent and Trademark Office*